310-334 SR

OR 3,976,897

1 89 215

United States Patent [19] X 89466

Tamura et al.

[11] 3,976,897

[45] Aug. 24, 1976

[54] PIEZOELECTRIC ELECTRO-ACOUSTIC DIAPHRAGM TRANSDUCER WITH COMPOSITE RESILIENT BACKING

[75] Inventors: Masahiko Tamura; Kiyonori Iwama; Toshikazu Yoshimi; Takashi Oyaba, all of Tokorozawa, Japan

[73] Assignee: Pioneer Electronic Corporation, Tokyo, Japan

[22] Filed: Feb. 12, 1975

[21] Appl. No.: 549,339

[30] Foreign Application Priority Data

Feb. 18, 1974 Japan .......................... 49-19523[U]
Feb. 18, 1974 Japan .......................... 49-19524[U]

[52] U.S. Cl. .................................. 310/8.2; 310/8.5; 310/9.4; 310/9.5; 310/9.6; 179/110 A

[51] Int. Cl.² .......................................... H01L 41/08

[58] Field of Search .................. 310/8, 8.2, 8.3, 8.5, 310/8.6, 9.1, 9.4, 9.5, 9.6; 179/110 A, 111 R, 111 E, 110 E, 180

[56] References Cited

UNITED STATES PATENTS

| | | | |
|---|---|---|---|
| 3,798,473 | 3/1974 | Murayama | 310/8.3 X |
| 3,832,580 | 8/1974 | Yamamuro | 310/8.3 X |

*Primary Examiner*—Mark O. Budd
*Attorney, Agent, or Firm*—Woodhams, Blanchard and Flynn

[57] ABSTRACT

An electro-acoustic transducer with a piezoelectric diaphragm which is backed with a plurality of different resilient members for imparting a suitable resiliency and/or tension to said diaphragm to highly improve its acoustic characteristics with a simple construction.

16 Claims, 3 Drawing Figures

PIEZOELECTRIC ELECTRO-ACOUSTIC DIAPHRAGM TRANSDUCER WITH COMPOSITE RESILIENT BACKING

This invention relates to a piezoelectric electroacoustic transducer employing a diaphragm made of a film of a piezoelectric material and wherein a suitable resiliency and/or tension is imparted to said diaphragm to make vibration in the direction normal to the plane thereof, and more particularly to an improvement in a piezoelectric electro-acoustic transducer of this kind in which a resilient element fitted to the diaphragm to impart the suitable resiliency and/or tension to said diaphragm is formed of a plurality of different resilient members, thereby to provide improved or desired acoustic characteristics.

As disclosed for example in U.S. Pat. No. 3,832,580, a thin film of a piezoelectric material is employed with a great advantage for a diaphragm of an electromechanical or mechano-electrical transducer. A conventional piezoelectric electro-acoustic transducer employing a piezoelectric diaphragm and having a resilient element for imparting a resiliency and/or tension to said diaphragm is so constructed as shown in FIG. 1 wherein the resilient element 3 of a uniform property is disposed on a base plate 4 and the diaphragm 1 of piezoelectric thin film is resiliently and arcuately backed by the resilient element 3 and supported by a support member 2 while having applied thereto a resiliency and/or tension thereby. The conventional piezoelectric electroacoustic transducer of this type, however, has some shortcomings that a transducing efficiency or an efficiency of converting electric energy into acoustic energy is comparatively low and that frequency characteristics (especially in a low frequency range) are not satisfactory due to its uniform interface contact between the diaphragm and the resilient element.

The inventors of the present invention have made intensive and extensive study of the transducer of this kind pursuing an improvement of the resilient element in view to provide a transducer capable of overcoming the disadvantages of the conventional one, easy to manufacture and economically feasible to utilize. They have found that the provision of plural different resilient members affords desired improvement in the characteristics, achieving the above-mentioned task.

It is therefore an object of the present invention to provide an electro-acoustic transducer with a piezoelectric thin film and plurality of different resilient members for imparting suitable resiliency and/or tension to said thin film to present desired characteristics.

According to the present invention, there is provided in a piezoelectric electro-acoustic transducer employing a diaphragm made of a flexible piezoelectric material and comprising a resilient backing element fitted to said diaphragm to impart at least one of a resiliency and tension to said diaphragm, the improvement characterized by the resilient element formed of a plurality of different resilient members for imparting different properties in respect of at least one of the resiliency and tension to said diaphragm.

The invention will be better understood from the following description taken in connection with the accompanying drawings in which.

In the drawings and the following description, like portions or parts are denoted by like numerals or characters.

Figure 1:
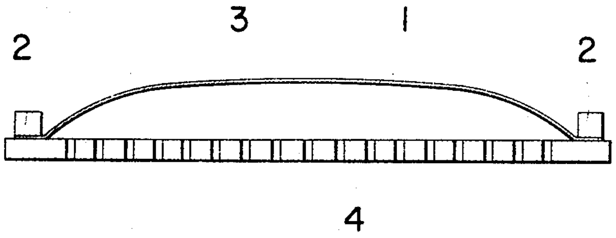
Fig. 1 Prior art
FIG. 1 is an explanatory sectional view of a conventional piezoelectric electro-acoustic transducer having a single resilient member.
Figure 2:
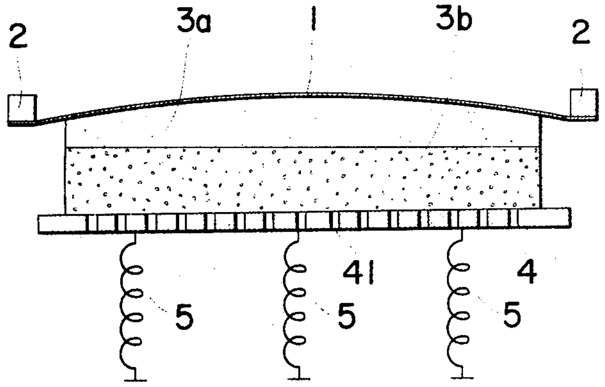
FIG. 2 is an explanatory sectional view of one form of piezoelectric full range loudspeaker according to the present invention.

Referring now to FIG. 2, there is shown one form of piezoelectric full range loudspeaker according to the present invention. Numeral 1 diaphragm a diaphragm made of a thin film of high molecular weight polymer materials having a flexibility and subjected to a treatment to have a piezoelectricity, such as polyvinylidene fluoride ($PVF_2$), polyvinyl fluoride (PVF), polyvinyl chloride (PVC), a nylon-11 or polypeptide (PMG), etc. Numeral 2 designates a support member made of a rigid material for supporting said diaphragm 1 of thin film. Numerals 3*a* and 3*b* are resilient backing members made of a resilient synthetic resin such as polyurethane foam etc. Said resilient members 3*a* and 3*b* differ from each other for example in properties such as hardness, or shapes etc. Said resilient members 3*a* and 3*b* are disposed in pile in the direction of the thickness of the diaphragm 1. In the present embodiment, the resilient member 3*a* made of a softer material is fitted directly to the diaphragm 1 in the direction of the thickness thereof and the other resilient member 3*b* arranged in pile and having a harder property than said member 3*a* is also fitted to said diaphragm 1 through said member 3*a*. Numeral 4 indicates a base plate made of a rigid material and formed with a predetermined number of openings 41 of a given size. Springs 5 are provided to press said base plate 4. The pressure applied to said plate 4 by said spring 5 is adjustable.

The resilient members 3*a* and 3*b* having different hardness and employed in the present embodiment are easily available by using resilient materials of different kinds or using resilient materials made of the same base materials but having different size cells.

In the thus constructed full range loudspeaker, the diaphragm 1 is supported by the support member 2, the resilient members 3*a* and 3*b* in pile are fitted to one surface of the diaphragm 1, and the base plate 4 presses against said diaphragm 1 the resilient members 3*a* and 3*b* by the action of the springs 5 to apply suitable resiliency and/or tension to said diaphragm 1.

The soft fit or abutment by the resilient member 3*a* of softer material on the diaphragm 1 serves to well improve the characteristics and transducing efficiency in a low frequency range, while the resilient member 3*b* of harder material serves mainly to provide suitable and sufficient tension to the diaphragm 1.

Though the foregoing description of this embodiment is made referring to the application of the present invention to the full range loudspeaker, the present invention may also be applied to piezoelectric loudspeakers for specific ranges (woofers, middle range loudspeakers, tweeters). In these cases, desired acoustic characteristics in respective ranges, such as improvement in frequency characteristics and transducing efficiency can be obtained by appropriately exchanging the different resilient members. For example, a structure wherein the resilient members 3*a* and 3*b* are disposed vice versa, to wit, the resilient member of harder materials are fitted directly to the diaphragm and the resilient member of softer material is in turn applied thereto is just suitable for tweeters etc. improving frequency characteristics or response in a high frequency range and presenting a high sound pressure level in the high frequency range.

In case the resilient members 3a and 3b differing from each other in shapes are employed in the present embodiment, the diaphragm 1 is caused to have properties in respect of locally differing resiliency and/or tension.

Figure 3:
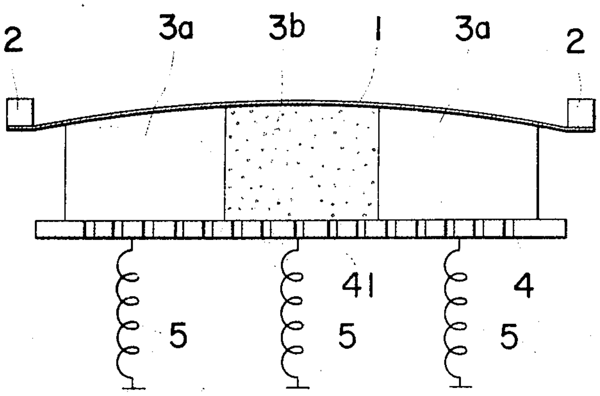
FIG. 3 is an explanatory sectional view of another form of piezoelectric full range loudspeaker according to the present invention.

In FIG. 3 there is shown another form of piezoelectric full range loudspeaker according to the present invention. In this embodiment, a resilient member 3b made of materials similar to that of the foregoing embodiment and applied centrally to a diaphragm 1 has a property harder than those of resilient members 3a which are disposed in outer positions so as to be in contact with said diaphragm 1.

Thus, the loudspeaker of this embodiment is so constructed that the resilient member 3b is fitted centrally to the diaphragm 1 and the resilient members 3a are fitted in the outer positions to said diaphragm 1 to apply different interface contacts and impart locally differing resiliency and/or tension to said diaphragm 1, well attaining desired improvement in acoustic characteristics.

This embodiment may also be applied to other of loudspeakers specific for respective ranges (woofers, middle range loudspeakers, tweeters etc.) to improve respective acoustic characteristics.

The invention as set forth above is further applicable to other type of piezoelectric electro-acoustic transducers with piezoelectric diaphragms, such as stereophonic headphones, microphones, phonograph cartridges, etc. with a great advantage and effect such as improvement in frequency characteristics and sound pressure level (transducing efficiency) and control of the frequency characteristics.

What is claimed is:

1. In a piezoelectric electro-acoustic transducer including a diaphragm of flexible piezoelectric material and a resilient backing element pressed against and resiliently backing and shaping the vibratory surface of said diaphragm, the improvement comprised in that said resilient element incorporates a plurality of different resilient members of which one differs from another in at least one physical characteristic thereof for imparting different operating characteristics to the transducer.

2. A piezoelectric electro-acoustic transducer as set forth in claim 1, wherein said resilient members differ in properties and are laid one on another in the direction of the thickness of the diaphragm.

3. A piezoelectric electro-acoustic transducer as set forth in claim 1, wherein said resilient members differ in properties and are disposed side-by-side along the plane of the diaphragm.

4. A piezoelectric electro-acoustic transducer as set forth in claim 1, wherein said resilient members differ in shape and are laid one on another in the direction of the thickness of the diaphragm.

5. In a piezoelectric electro-acoustic transducer of the type including a flexible piezoelectric diaphragm, means fixing opposed edge portions of said diaphragm with respect to each other, resilient backing means pressed in area contact against the back face of said diaphragm over at least the major portion of the vibratory area of such diaphragm for tensioning said diaphragm along the surface thereof and arcuately and resiliently backing the diaphragm transversely of its surface, the improvement comprised in that said resilient backing means incorporates first and second resilient backing members at least one of which is in said area contact with the back face of said diaphragm, said resilient members differing from each other in resiliency such that said first resilient backing member is softer than said second resilient backing member.

6. A transducer as set forth in claim 5 wherein said first and second resilient backing members both extend widthwise of said diaphragm, one of said first and second resilient backing members being in backing contact with the back face of said diaphragm and the other of said first and second resilient backing members being in backing contact with the back face of said one resilient backing member and pressing same against the diaphragm.

7. A transducer as set forth in claim 6 wherein said softer, first resilient backing member directly backs said diaphragm in sandwiched relation between said diaphragm and the harder, second resilient backing member, so as to enhance the low frequency efficiency and sound pressure level of said transducer.

8. A transducer as set forth in claim 6 wherein said second, harder resilient backing member directly engages said diaphragm and is sandwiched between said diaphragm and first, softer resilient backing member, so as to enhance the high frequency efficiency and sound pressure level of said transducer.

9. A transducer as set forth in claim 5 in which said respectively harder and softer resilient backing members are disposed side-by-side and each engage and press against the back face of said diaphragm so as to vary locally the resilient support of the diaphragm.

10. A transducer as set forth in claim 9 in which said harder, second resilient backing member is disposed centrally of said diaphragm and is flanked laterally of said diaphragm by first, softer resilient backing members, so as to provide locally differing interface contact characteristics and backing resiliency for the central and outer portions of the diaphragm.

11. A transducer according to claim 5 in which at least one of said first and second resilient backing members is in area contact with the back face of said diaphragm, said resilient backing members have opposed faces in contact with each other, and including a rigid base member, said first and second resilient backing members both being sandwiched between said diaphragm and rigid base member and pressed by said base member against said diaphragm.

12. A transducer as set forth in claim 11 in which said first and second resilient backing members are of different resilient material.

13. A transducer as set forth in claim 11 in which said first and second resilient backing members are both of resilient foam material but the foam material cell size differs as between said first and second resilient backing members.

14. A transducer as set forth in claim 11 in which said rigid base member comprises a rigid base plate and including spring means urging said resilient base plate toward the back face of said diaphragm said fixing means comprising fixed supports fixedly locating opposed edges of said diaphragm, the vibratory area of said diaphragm extending between said fixed supports, said first and second resilient backing members comprising resilient foam pads in pressed sandwiched relation between said base plate and the back face of said diaphragm wherein the noncontacting faces of said resilient backing members respectively contact the back face of said diaphragm and the front face of said rigid base plate.

15. A transducer as set forth in claim 14 in which said transducer is a wide range loudspeaker with the first, softer resilient backing member in surface contact with the back face of said diaphragm between said supports to enhance the low frequency efficiency and sound pressure level of such loudspeaker and said second, harder resilient backing member transferring the pressure of said base plate to said softer resilient backing member to tension said diaphragm.

16. A transducer as set forth in claim 11 in which said transducer is a full range loudspeaker, said first and second resilient backing members each engaging and being directly sandwiched between said diaphragm and rigid base plate, said harder resilient backing member being disposed centrally of said rigid backing plate and diaphragm and said softer resilient backing member comprising portions flanking said harder resilient backing member laterally of said diaphragm so as to engage only the laterally outer portions of said diaphragm.

* * * * *